United States Patent
Zhang et al.

(10) Patent No.: US 11,545,933 B2
(45) Date of Patent: Jan. 3, 2023

(54) REAL-TIME CORRECTION METHOD FOR OVEN CONTROLLED CRYSTAL OSCILLATOR AND ELECTROMAGNETIC RECEIVER

(71) Applicant: Institute of Geology and Geophysics, Chinese Academy of Sciences, Beijing (CN)

(72) Inventors: Tianxin Zhang, Beijing (CN); Zhongxing Wang, Beijing (CN); Qingyun Di, Beijing (CN); Lili Kang, Beijing (CN); Renzhong Pei, Beijing (CN); Zhiyao Liu, Beijing (CN)

(73) Assignee: Institute of Geology and Geophysics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 17/840,433

(22) Filed: Jun. 14, 2022

(65) Prior Publication Data

US 2022/0385232 A1    Dec. 1, 2022

Related U.S. Application Data

(63) Continuation of application No. PCT/CN2022/070028, filed on Jan. 4, 2022.

(30) Foreign Application Priority Data

Jun. 1, 2021   (CN) ................. 202110609918.6

(51) Int. Cl.
*H03B 5/04* (2006.01)
*H03B 5/32* (2006.01)
(Continued)

(52) U.S. Cl.
CPC ........... *H03B 5/04* (2013.01); *H03B 5/32* (2013.01); *H03L 1/026* (2013.01); *H03L 1/028* (2013.01); *H03L 1/04* (2013.01); *H03L 7/099* (2013.01)

(58) Field of Classification Search
CPC ....................................................... H03B 5/04
(Continued)

(56) References Cited

U.S. PATENT DOCUMENTS

2009/0080290 A1 *   3/2009   Ray ................ G01V 1/00
                                              367/51
2014/0104108 A1 *   4/2014   Holford ........... G01S 5/021
                                              342/385
(Continued)

FOREIGN PATENT DOCUMENTS

CN    101079687 A    11/2007
CN    101799658 A     8/2010
(Continued)

OTHER PUBLICATIONS

International Search Report of PCT/CN2022/070028.
Tianxin Zhang et al., "Real Time Correction method of OCXO for Ground Electromagnetic Instrument Based on GPS", May 21, 2021.

*Primary Examiner* — Joseph Chang
(74) *Attorney, Agent, or Firm* — Dragon Sun Law Firm, PC; Jinggao Li; Nathaniel Perkins

(57) ABSTRACT

The present disclosure provides a real-time correction method for an Oven Controlled Crystal (Xtal) Oscillator (OCXO) and an electromagnetic receiver. The real-time correction method for an OCXO includes: performing frequency multiplication on a reference clock signal to generate a first measurement signal and a second measurement signal; identifying a rising edge of each pulse per second on the basis of the first measurement signal to obtain a gate time T; obtaining a frequency of the second measurement signal (Continued)

according to the gate time T; and adjusting a frequency of the reference clock signal at least on the basis that an absolute value of a difference between two adjacent frequencies obtained of the second measurement signal is greater than a standard frequency difference.

6 Claims, 7 Drawing Sheets

(51) Int. Cl.
*H03L 1/02* (2006.01)
*H03L 7/099* (2006.01)
*H03L 1/04* (2006.01)

(58) Field of Classification Search
USPC .......................................................... 331/176
See application file for complete search history.

(56) References Cited

U.S. PATENT DOCUMENTS

| 2018/0109263 A1* | 4/2018 | Wanner | H03B 5/32 |
| 2020/0021300 A1 | 1/2020 | Sudo | |

FOREIGN PATENT DOCUMENTS

| CN | 103616814 A | 3/2014 |
| CN | 112152618 A | 3/2014 |
| CN | 104135332 A | 11/2014 |
| CN | 204517793 U | 7/2015 |
| CN | 107870262 A | 4/2018 |
| CN | 113359191 A | 9/2021 |
| CN | 113489486 A | 10/2021 |
| JP | 2018152647 A | 9/2018 |

* cited by examiner $$\Delta cnt_0 = |cnt_{m0} - cnt_m| \quad \text{Expression 2}$$

$$\Delta cnt_1 = |cnt_{m1} - cnt_{m0}| \quad \text{Expression 3}$$

$$\Delta cnt_2 = |cnt_{m2} - cnt_{m1}| \quad \text{Expression 4}$$

$$\Delta cnt_3 = |cnt_{m3} - cnt_{m2}| \quad \text{Expression 5}$$

REAL-TIME CORRECTION METHOD FOR OVEN CONTROLLED CRYSTAL OSCILLATOR AND ELECTROMAGNETIC RECEIVER

CROSS REFERENCE TO RELATED DISCLOSURES

This application is a bypass continuation application of International Patent Application No.: PCT/CN2022/070028. The present disclosure is based on PCT Application No. PCT/CN2022/070028, filed Jan. 4, 2021, and from Chinese Patent Application No. 202110609918.6, filed on Jun. 1, 2021, and claims priorities to the same, the entire contents of which are incorporated herein by reference.

TECHNICAL FIELD

The present disclosure relates to the technical field of exploration, in particular to a real-time correction method for an oven controlled crystal oscillator and an electromagnetic receiver.

BACKGROUND ART

Electrical exploration, one of effective means for mineral resource exploration, has various variety and high adaptability to be widely used in the fields of deep structure exploration, mineral resource exploration, hydrological and engineering exploration, etc. Depending on the nature of the field source, electrical exploration has natural source methods and artificial source methods. The magnetotelluric (MT) method in the natural source methods has the largest detection depth at present, and the method proposed and established by the former Soviet Union scholar Tikhonov and the French scholar Cagniard in the 1950s is important in the fields of earth deep structure detection, natural earthquake prediction, etc. A controlled source audio-frequency magnetotelluric (CSAMT) method is an artificial source frequency domain electromagnetic detection method proposed by D. W. Strangway and his student Myron Goldtein of Toronto University Canada in early 1970s, in which a natural field source is replaced by an artificial field source, an MT observation mode is still used, the defect of randomness of the MT field source is overcome, the signal strength is greatly improved, except that the detection depth is less than that of MT, and the working efficiency, the precision and the transverse and longitudinal resolution are obviously improved.

According to the principles of the MT/AMT and CSAMT methods, the phase offset of an earth system to an excitation signal reflects the polarization features of the earth, which is important for distinguishing static effects, correcting and identifying the position of a transitional zone, and the precision of phase measurement is determined by the clock accuracy and stability of a ground electromagnetic receiver. The ground electromagnetic receiver has comprised the following correction methods: 1, the ground electromagnetic receiver is corrected once by means of energization, however, after correction, output is influenced by the aging rate of a crystal oscillator, etc. over time, and the output precision becomes lower; 2, when the ground electromagnetic receiver is powered on, the adjustment is started, however, the ground electromagnetic receiver is over-adjusted, causing the "false correction OK" problem, that is, voltage of the control pin of the ground electromagnetic receiver is greater than an actual correction value, resulting in an output frequency higher than a target value; and 3, the ground electromagnetic receiver is adjusted after being stabilized, but the adjustment method has larger errors and needs more time.

Therefore, how to correct the ground electromagnetic receiver in real time requires to be solved urgently by technicians in the field.

SUMMARY

The objective of the present disclosure is to provide a real-time correction method for an oven controlled crystal oscillator and an electromagnetic receiver, so as to solve the problems that a ground electromagnetic receiver has poor correction precision and long correction duration.

For solving the above problems, according to one aspect of the present disclosure, a real-time correction method for an oven controlled crystal oscillator is provided. The real-time correction method for an oven controlled crystal oscillator includes: performing frequency multiplication on a reference clock signal to generate a first measurement signal and a second measurement signal;

identifying a rising edge of each pulse per second on the basis of the first measurement signal to obtain a gate time T;

obtaining a frequency of the second measurement signal according to the gate time T; and adjusting a frequency of the reference clock signal at least on the basis that an absolute value of a difference between two adjacent frequencies obtained of the second measurement signal is greater than a standard frequency difference.

In one aspect of the embodiment of the present disclosure, the reference clock signal is subject to frequency multiplication to generate a first measurement signal and a second measurement signal with different frequencies, and the frequency of the second measurement signal is higher, such that a gate time for measurement is equivalently improved, and measurement precision is improved; in another aspect, a frequency of the first measurement signal is a multiplied frequency of the reference clock signal, which may effectively guarantee identification of a rising edge of a pulse per second (PPS), so as to effectively solve the problem about identification of the rising edge of PPS; and in yet another aspect, by observing an absolute value of a difference between two or more frequencies of the second measurement signal and comparing the absolute value of the difference between the frequencies of the second measurement signal with a standard frequency difference, whether current output of oven controlled crystal oscillator is stable may be known, and the frequency of the reference clock signal may also be adjusted accordingly.

Further, the performing frequency multiplication on a reference clock signal to generate a first measurement signal and a second measurement signal includes:

performing frequency multiplication on the reference clock signal according to a conditional expression $f_1 = N_1 f_0$ to obtain the first measurement signal, where $f_0$ is the frequency of the reference clock signal, $f_1$ is a frequency of the first measurement signal, and $N_1$ is a positive integer; and performing frequency multiplication on the reference clock signal according to a conditional expression $f_2 = N_2 f_0$ to obtain the second measurement signal, where $f_2$ is the frequency of the second measurement signal, and $N_2$ is a positive integer;

where a value of the frequency $f_0$ of the reference clock signal ranges from 5 MHz to 50 MHz, the frequency $f_1$ of the first measurement signal $\leq 62.5$ MHz, the positive integer $N_2 = nN_1$, and $4 \leq n \leq 16$.

Further, adjusting the frequency of the reference clock signal includes:

acquiring a plurality of first frequencies of the second measurement signal according to a first gate time $T_1$; and using a first step value to adjust the frequency of the reference clock signal on the basis that an absolute value of a difference between two adjacent first frequencies is greater than a first standard frequency difference.

Preferably, after using a first step value to adjust the frequency of the reference clock signal until an absolute value of a difference between two adjacent first frequencies is not greater than a first standard frequency difference, adjusting the frequency of the reference clock signal further includes:

acquiring a plurality of second frequencies of the second measurement signal according to a second gate time $T_2$; and using a second step value to adjust the frequency of the reference clock signal on the basis that an absolute value of a difference between two adjacent second frequencies is greater than a second standard frequency difference and an error of the second frequencies is greater than a first accuracy error;

where the gate time $T_2$ is equal to the gate time $T_1$, and the second step value is equal to the first step value.

Preferably, after using a second step value to adjust the frequency of the reference clock signal until an absolute value of a difference between two adjacent second frequencies is not greater than a second standard frequency difference and an error of the second frequencies is not greater than a first accuracy error, adjusting the frequency of the reference clock signal further includes:

acquiring a plurality of third frequencies of the second measurement signal according to a third gate time $T_3$; and using a third step value to adjust the frequency of the reference clock signal on the basis that an absolute value of a difference between two adjacent third frequencies is greater than a third standard frequency difference and an error of the third frequencies is greater than a second accuracy error; where the gate time $T_3$ is greater than the gate time $T_2$, and the third step value is less than the second step value.

Preferably, after using a third step value to adjust the frequency of the reference clock signal until an absolute value of a difference between two adjacent third frequencies is not greater than a third standard frequency difference and an error of the third frequencies is not greater than a second accuracy error, adjusting the frequency of the reference clock signal further includes:

acquiring a fourth frequency of the second measurement signal according to a fourth gate time $T_4$; and using a fourth step value to adjust the frequency of the reference clock signal on the basis of the fourth frequency acquired of the second measurement signal; where the gate time $T_4$ is greater than the gate time $T_3$, and the fourth step value is less than the third step value.

In the second aspect of the present disclosure, the present disclosure further provides an electromagnetic receiver, including:

a frequency multiplication unit configured to perform frequency multiplication on a reference clock signal to generate a first measurement signal and a second measurement signal;

an identification unit configured to identify a rising edge of each pulse per second on the basis of the first measurement signal to obtain a gate time T;

a statistical unit configured to obtain a frequency of the second measurement signal according to the gate time T; and a correction sub-module configured to adjust a frequency of the reference clock signal at least on the basis that an absolute value of a difference between two adjacent frequencies obtained of the second measurement signal is greater than a standard frequency difference.

Further, the electromagnetic receiver includes:

the frequency multiplication unit performs frequency multiplication on the reference clock signal according to a conditional expression $f_1=N_1f_0$ to obtain the first measurement signal, where $f_0$ is the frequency of the reference clock signal, $f_1$ is a frequency of the first measurement signal, and $N_1$ is a positive integer; and the frequency multiplication unit performs frequency multiplication on the reference clock signal according to a conditional expression $f_2=N_2f_0$ to obtain the second measurement signal, where $f_2$ is the frequencies of the second measurement signal, and $N_2$ is a positive integer; where a value of the frequency $f_0$ of the reference clock signal ranges from 5 MHz to 50 MHz, the frequency $f_1$ of the first measurement signal$\leq$62.5 MHz, the positive integer $N_2=nN_1$, and $4\leq n\leq 16$.

Further, the correction sub-module includes a first correction unit, and the first correction unit includes:

a first acquisition sub-unit configured to acquire a plurality of first frequencies of the second measurement signal according to a first gate time $T_1$; and a first adjustment sub-unit configured to use a first step value to adjust the frequency of the reference clock signal on the basis that an absolute value of a difference between two adjacent first frequencies is greater than a first standard frequency difference.

Preferably, the correction sub-module further includes a second correction unit, and the second correction unit includes:

a second acquisition sub-unit configured to acquire a plurality of second frequencies of the second measurement signal according to a second gate time $T_2$; and a second adjustment sub-unit configured to use a second step value to adjust the frequency of the reference clock signal on the basis that an absolute value of a difference between two adjacent second frequencies is greater than a second standard frequency difference and an error of the second frequencies is greater than a first accuracy error; where the gate time $T_2$ is equal to the gate time $T_1$, and the second step value is equal to the first step value. Preferably, the correction sub-module further includes a third correction unit, and the third correction unit includes:

a third acquisition sub-unit configured to acquire a plurality of third frequencies of the second measurement signal according to a third gate time $T_3$; and a third adjustment sub-unit configured to use a third step value to adjust the frequency of the reference clock signal on the basis that an absolute value of a difference between two adjacent third frequencies is greater than a third standard frequency difference and an error of the third frequencies is greater than a second accuracy error; where the gate time $T_3$ is greater than the gate time $T_2$, and the third step value is less than the second step value.

Preferably, the correction sub-module further includes a fourth correction unit, and the fourth correction unit includes:

a fourth acquisition sub-unit configured to acquire a fourth frequency of the second measurement signal according to a fourth gate time $T_4$; and a fourth adjustment sub-unit configured to use a fourth step value to adjust the frequency of the reference clock signal on the basis of the fourth frequency acquired of the second measurement signal; where the gate time $T_4$ is greater than the gate time $T_3$, and the fourth step value is less than the third step value.

The above-mentioned technical solution in the present disclosure has the following beneficial effects:

1. The present disclosure provides a real-time correction method for an oven controlled crystal oscillator. The method includes: performing frequency multiplication on a reference clock signal to generate a first measurement signal and a second measurement signal; identifying a rising edge of each pulse per second on the basis of the first measurement signal to obtain a gate time T; obtaining a frequency of the second measurement signal according to the gate time T; and adjusting a frequency of the reference clock signal at least on the basis that an absolute value of a difference between two adjacent frequencies obtained of the second measurement signal is greater than a standard frequency difference. In one aspect of the embodiment of the present disclosure, the reference clock signal is subject to frequency multiplication to generate a first measurement signal and a second measurement signal with different frequencies, and the frequency of the second measurement signal is higher, such that a gate time for measurement is equivalently improved, and measurement precision is improved; in another aspect, a frequency of the first measurement signal is a multiplied frequency of the reference clock signal, which may effectively guarantee identification of a rising edge of a pulse per second (PPS), so as to effectively solve the problem about identification of the rising edge of PPS; and in yet another aspect, by observing an absolute value of a difference between two or more frequencies of the second measurement signal and comparing the absolute value of the difference between the frequencies of the second measurement signal with a standard frequency difference, whether current output of oven controlled crystal oscillator is stable may be known, and the frequency of the reference clock signal may also be adjusted accordingly.

DETAILED DESCRIPTION OF THE EMBODIMENTS

For making the objectives, technical solutions and advantages of the present disclosure clearer, the present disclosure will be described in further detail below in conjunction with the specific embodiments with reference to the accompanying drawings. It is to be understood that these descriptions are merely illustrative and not intended to limit the scope of the present disclosure. Moreover, in the following explanation, descriptions of well-known structures and techniques are omitted to avoid unnecessarily obscuring the concepts of the present disclosure.

For solving the above technical problem, the technical solution used in the present disclosure is as follows.

The present disclosure will be elaborated hereafter in conjunction with the accompanying drawings and embodiments.

Figure 1:
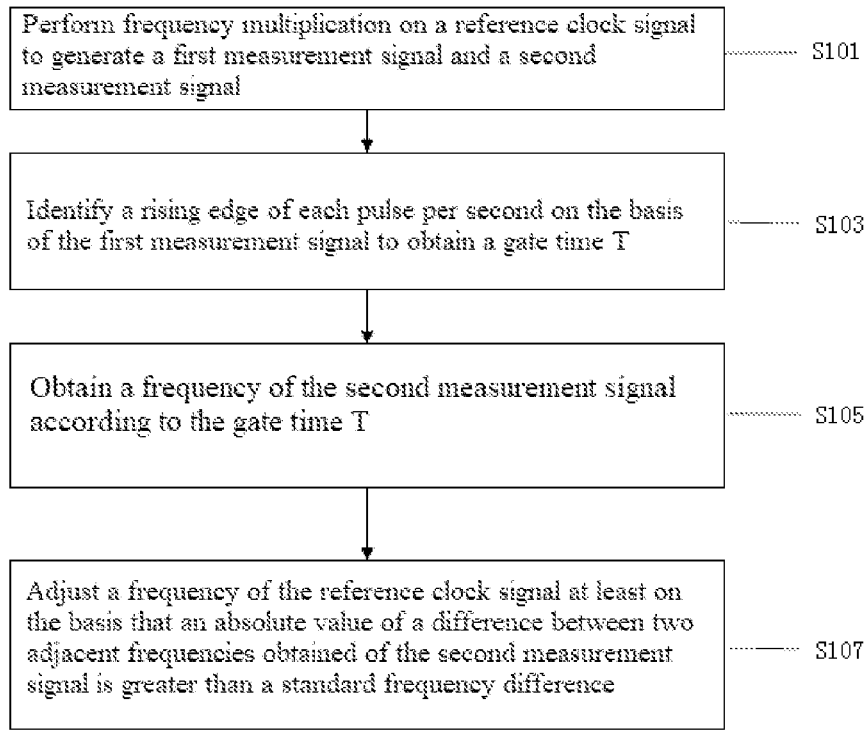
FIG. 1 is a flowchart of a real-time correction method for an oven controlled crystal oscillator provided in the present disclosure.

In one embodiment, as shown in FIG. 1, the present disclosure provides a real-time correction method for an oven controlled crystal oscillator. The method includes: S101, frequency multiplication is performed on a reference clock signal to generate a first measurement signal and a second measurement signal.

Specifically, a frequency multiplier is configured to perform frequency multiplication on the reference clock signal to generate the first measurement signal and the second measurement signal, the first measurement signal and the second measurement signal have different frequency multiplication coefficients, and the frequency multiplication coefficient of the second measurement signal is greater than that of the first measurement signal. The frequency multiplier is a phase-locked loop.

S103, a rising edge of each pulse per second (PPS) is identified on the basis of the first measurement signal to obtain a gate time T.

Specifically, the rising edge of each PPS is identified by using the first measurement signal, and a time length for exiting the gate times T is determined according to a rising edge identification result of the plurality of PPS.

S105, a frequency of the second measurement signal is obtained according to the gate time T.

The frequency of the second measurement signal is the multiplied frequency of the reference clock signal, on the basis of the determined gate time T, a measured second measurement signal is counted in one gate time T by using a frequency meter to obtain a count value counter of the measured second measurement signal, and the frequency of the measured second measurement signal may be computed by Expression 1: $f_m$=counter/T, where $f_m$ is expressed as the frequency of the second measurement signal.

S107, a frequency of the reference clock signal is adjusted at least on the basis that an absolute value of a difference between two adjacent frequencies obtained of the second measurement signal is greater than a standard frequency difference. The reference clock signal is generated by an oven controlled crystal oscillator of an electromagnetic receiver.

Based on at least two gate times T and Expression 1: $f_m$=counter/T, two frequency measurement values of the second measurement signal corresponding to two adjacent gate times T are computed, a difference between the two frequency measurement values of the adjacent second measurement signal is made, and the frequency of the reference clock signal is adjusted based on a comparison result that the absolute value of the difference between the two frequencies of the second measurement signal is greater than the standard frequency difference. The standard frequency difference is determined according to the frequency multiplication coefficient of the second measurement signal, the gate time T and a measurement error.

In one aspect of the embodiment of the present disclosure, the reference clock signal is subject to frequency multiplication to generate a first measurement signal and a second measurement signal with different frequencies, and the frequency of the second measurement signal is higher, such that a gate time for measurement is equivalently improved, and measurement precision is improved; in another aspect, a frequency of the first measurement signal is a multiplied frequency of the reference clock signal, which may effectively guarantee identification of a rising edge of a pulse per second (PPS), so as to effectively solve the problem about identification of the rising edge of PPS; and in yet another aspect, by observing an absolute value of a difference between two or more frequencies of the second measurement signal and comparing the absolute value of the difference between the frequencies of the second measurement signal with a standard frequency difference, whether current output of oven controlled crystal oscillator is stable may be known, and the frequency of the reference clock signal may also be adjusted.

In some embodiments, before S101, frequency multiplication is performed on a reference clock signal to generate a first measurement signal and a second measurement signal, the method further includes:

S201, satellite signals of navigation satellites are received, and a pulse per second is generated according to the satellite signals.

The navigation satellites constitute a navigation system, the navigation system with four or more navigation satellites may provide accurate geographic and time information to a surface of the earth or a near-earth surface, and the satellite signals of the navigation satellites are acquired by means of a global navigation satellite system (GNSS) module. The GNSS module generates the pulse per second (PPS) on the basis of the acquired satellite signals, the PPS having long-term stability.

S203, a reference clock source is provided, and a reference clock signal is transmitted on the basis of the reference clock source.

The oven controlled crystal oscillator (OCXO) is configured to provide a reference clock source, the OCXO uses a constant temperature device to keep a temperature of a quartz crystal resonator stable and reduces the amount of variation, caused by a surrounding temperature variation, of an output frequency of the oscillator, the OCXO is usually provided with a voltage control pin for adjusting a temperature of the constant temperature device, so as to control the output frequency of the OCXO, and then the frequency output of the OCXO has short-term stability. The OCXO transmits the reference clock signal on the basis of the reference clock source.

In some embodiments, the step that frequency multiplication is performed on a reference clock signal to generate a first measurement signal and a second measurement signal includes:

frequency multiplication is performed on the reference clock signal according to a conditional expression $f_1=N_1 f_0$ to obtain the first measurement signal, where $f_0$ is the frequency of the reference clock signal, $f_1$ is a frequency of the first measurement signal, and $N_1$ is a positive integer; and frequency multiplication is performed on the reference clock signal according to a conditional expression $f_2=N_2 f_0$ to obtain the second measurement signal, where $f_2$ is the frequencies of the second measurement signal, and $N_2$ is a positive integer;

where a value of the frequency $f_0$ of the reference clock signal ranges from 5 MHz to 50 MHz, the frequency $f_1$ of the first measurement signal $\leq 62.5$ MHz, the positive integer $N_2=nN_1$, and $4 \leq n \leq 16$.

Further, a standard frequency difference satisfies a conditional expression: $f_a=bN_2 T$, where $f_a$ is the standard frequency difference, b is a stability error, $N_2$ is a frequency multiplication coefficient of the second measurement signal, and T is a gate time.

Figure 2:
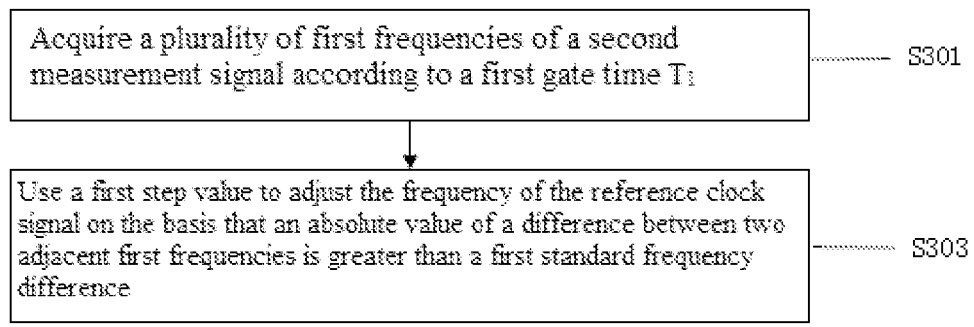
FIG. 2 is a flowchart of a real-time correction method for an oven controlled crystal oscillator provided in the present disclosure.

In other embodiments, as shown in FIG. 2, the step that the frequency of the reference clock signal is adjusted includes:

S301, a plurality of first frequencies of the second measurement signal are acquired according to a first gate time $T_1$. It will be appreciated that each first frequency is a measurement frequency, corresponding to the first gate time $T_1$, of the second measurement signal and is determined based on Expression 1: $f_m$=counter/T. The plurality of first frequencies are acquired based on a plurality of continuous first gate times $T_1$. Further, counter is a count value, $f_m$ is a frequency measurement value, and T is gate time.

S303, a first step value is used to adjust the frequency of the reference clock signal on the basis that an absolute value of a difference between two adjacent first frequencies is greater than a first standard frequency difference.

Specifically, the step of comparing the absolute value of the difference between the two adjacent first frequencies with the first standard frequency difference includes correspondingly acquiring one first frequency in the first first gate time $T_1$, and correspondingly obtaining one first frequency in the second first gate time $T_1$.

Further, the absolute value of the difference between the two first frequencies of the two continuous first gate times $T_1$ participates in the first comparison, and a first step value is used to adjust the frequency of the reference clock signal under the condition that the absolute value of the difference between the two adjacent first frequencies is greater than the first standard frequency difference. After adjustment, in a third gate time $T_1$, one first frequency is correspondingly obtained. a difference between the first frequency of the second first gate time $T_1$ and the first frequency of the third first gate time $T_1$ is made, and an absolute value of the difference is compared with the first standard frequency difference.

By analogy, cyclic comparison is performed until the absolute value of the difference between the two adjacent first frequencies is not greater than the first standard frequency difference, and the first step value is not used to adjust the frequency of the reference clock signal any more. It will be appreciated that, based on S303, the first frequencies of the second measurement signal gradually converge and gradually approach a standard frequency value of the second measurement signal, which is determined based on a conditional expression $f_2=N_2 f_0$.

The first standard frequency difference is determined based on a conditional expression of the standard frequency difference: $f_a=bN_2 T$, where the gate time $T=T_1$.

In the embodiment of the present disclosure, on one hand, the frequency output of the OCXO may be preliminarily subjected to stability determination analysis according to effective identification of the pulse per second by the first measurement signal and based on a comparison of the absolute value of the difference between the two adjacent first frequencies with the first standard frequency difference; and on the other hand, on the basis that the absolute value of the difference between the two adjacent first frequencies is greater than the first standard frequency difference, and the first step value is used to adjust the frequency of the reference clock signal until the first frequencies of the second measurement signal gradually converge and approach the standard frequency value of the second measurement signal, that is, the frequency of the reference clock signal is corrected.

Figure 3:
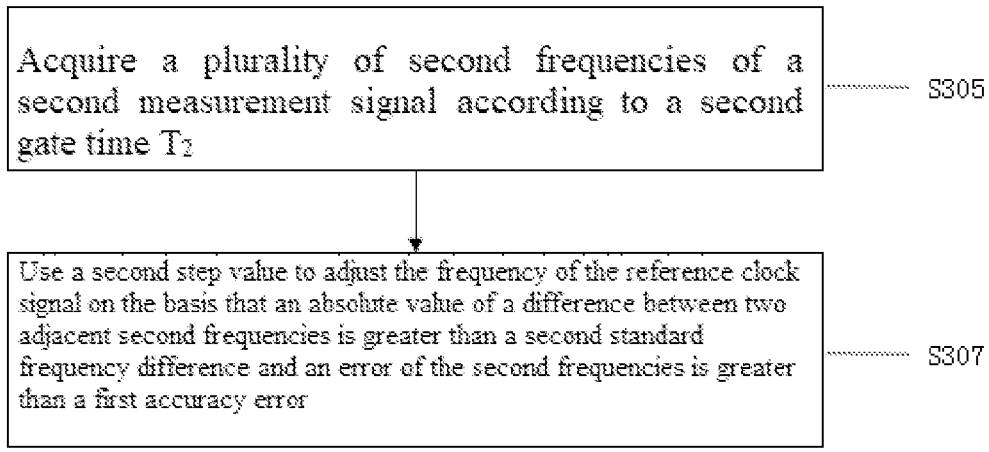
FIG. 3 is a flowchart of a real-time correction method for an oven controlled crystal oscillator provided in the present disclosure.

In some embodiments, as shown in FIG. 3, the step of after using a first step value to adjust the frequency of the reference clock signal until an absolute value of a difference between two adjacent first frequencies is not greater than a first standard frequency difference, adjusting the frequency of the reference clock signal further includes:

S305, a plurality of second frequencies of the second measurement signal are acquired according to a second gate time $T_2$.

It will be appreciated that each second frequency is a measurement frequency, corresponding to the second gate time $T_2$, of the second measurement signal and is determined based on Expression 1: $f_m$=counter/T. The plurality of second frequencies are acquired based on a plurality of continuous second gate times $T_2$.

S307, a second step value is used to adjust the frequency of the reference clock signal on the basis that an absolute value of a difference between two adjacent second frequencies is greater than a second standard frequency difference and an error of the second frequencies is greater than a first accuracy error.

Specifically, the step of comparing the absolute value of the difference between the two adjacent second frequencies with the second standard frequency difference and comparing the error of the second frequencies with the first accuracy error includes correspondingly acquiring one second frequency in the first second gate time $T_2$, and correspondingly acquiring one second frequency in the second second gate time $T_2$. The first accuracy error is determined by the second gate time $T_2$, and the first accuracy error is used for representing an error range between the second frequency of the second measurement signal and the standard frequency of the second measurement signal.

Further, the absolute value of the difference between the two second frequencies of the two continuous second gate times $T_2$ participates in the first comparison, and the second step value is used to adjust the frequency of the reference clock signal under the conditions that the absolute value of the difference between the two adjacent second frequencies is greater than the second standard frequency difference and an error of the second frequencies is greater than a first accuracy error. After adjustment, in a third gate time $T_2$, one second frequency is correspondingly obtained. A difference between the second frequency of the second second gate time $T_2$ and the second frequency of the third second gate time $T_2$ is made, an absolute value of the difference is compared with the second standard frequency difference, and an error of the second frequency of the third second gate time $T_2$ is compared with the first accuracy error.

By analogy, cyclic comparison is performed until the absolute value of the difference between the two adjacent second frequencies is not greater than the second standard frequency difference and the error of the second frequencies is not greater than the first accuracy error, and the second step value is not used to adjust the frequency of the reference clock signal any more. It will be appreciated that, based on S307, the second frequencies of the second measurement signal gradually converge and gradually approach the standard frequency value of the second measurement signal, which is determined based on the conditional expression $f_2=N_2f_0$.

The second standard frequency difference is determined based on the conditional expression of the standard frequency difference: $f_a=bN_2T$, where the gate time $T=T_2$.

In the embodiment of the present disclosure, the second measurement signal output in S303 is further adjusting according to S305 and S307, and based on comparison that the absolute value of the difference between the two adjacent second frequencies is greater than the second standard frequency difference and the error of the second frequencies is not greater than the first accuracy error, the second step value is used to adjust the frequency of the reference clock signal until the second frequencies of the second measurement signal gradually converge and approach the standard frequency value of the second measurement signal, such that the frequency of the reference clock signal is further corrected, and frequency output of the reference clock signal tends to a steady state.

In some embodiments, the gate time $T_2$ is equal to the gate time $T_1$, and the second step value is equal to the first step value.

Figure 4:
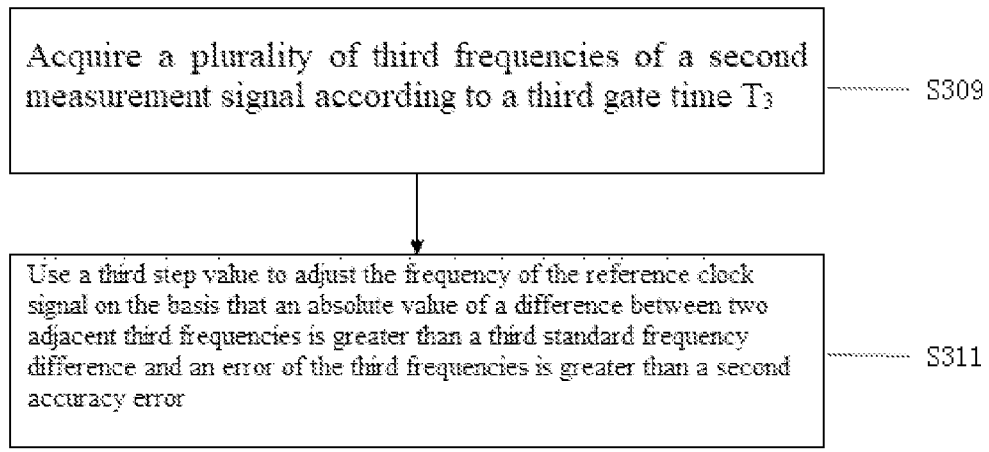
FIG. 4 is a flowchart of a real-time correction method for an oven controlled crystal oscillator provided in the present disclosure.

In some other embodiments, as shown in FIG. 4, after using a second step value to adjust the frequency of the reference clock signal until an absolute value of a difference between two adjacent second frequencies is not greater than a second standard frequency difference and an error of the second frequencies is not greater than a first accuracy error, the step of adjusting the frequency of the reference clock signal further includes:

S309, a plurality of third frequencies of the second measurement signal are acquired according to a third gate time $T_3$.

It will be appreciated that each third frequency is a measurement frequency, corresponding to the third gate time $T_3$, of the second measurement signal and is determined based on Expression 1: $f_m$=counter/T. The plurality of third frequencies are acquired based on a plurality of continuous third gate times $T_3$.

S311, a third step value is used to adjust the frequency of the reference clock signal on the basis that an absolute value of a difference between two adjacent third frequencies is greater than a third standard frequency difference and an error of the third frequencies is greater than a second accuracy error.

Specifically, the step of comparing the absolute value of the difference between the two adjacent third frequencies with the third standard frequency difference and comparing the error of the third frequencies with the second accuracy error includes correspondingly acquiring one third frequency in the first third gate time $T_3$, and correspondingly acquiring one third frequency in the second third gate time $T_3$. The second accuracy error is determined by the third gate time $T_3$, and the second accuracy error is used for representing an error range between the third frequency of the second measurement signal and the standard frequency of the second measurement signal.

Further, the absolute value of the difference between the two third frequencies of the two continuous third gate times $T_3$ participates in the first comparison, and the third step value is used to adjust the frequency of the reference clock signal under the conditions that the absolute value of the difference between the two adjacent third frequencies is greater than the third standard frequency difference and an error of the third frequencies is greater than the second accuracy error. After adjustment, in a third gate time $T_3$, one third frequency is correspondingly obtained. A difference between the third frequency of the second third gate time $T_3$ and the third frequency of the third third gate time $T_3$ is made, an absolute value of the difference is compared with the third standard frequency difference, and an error of the third frequency of the third third gate time $T_3$ is compared with the second accuracy error.

By analogy, cyclic comparison is performed until the absolute value of the difference between the two adjacent third frequencies is not greater than the third standard frequency difference and the error of the third frequencies is not greater than the second accuracy error, and the third step value is not used to adjust the frequency of the reference clock signal any more. It will be appreciated that, based on S311, the third frequencies of the second measurement signal gradually converge and gradually approach the standard frequency value of the second measurement signal, which is determined based on the conditional expression $f_2=N_2f_0$.

The third standard frequency difference is determined based on a conditional expression of the standard frequency difference: $f_a=bN_2T$, where the gate time $T=T_3$.

In the embodiment of the present disclosure, the second measurement signal output in S307 is further adjusting according to S309 and S311, and based on comparison that the absolute value of the difference between the two adjacent third frequencies is greater than the third standard frequency difference and the error of the third frequencies is greater than the second accuracy error, the third step value is used to adjust the frequency of the reference clock signal until the third frequencies of the second measurement signal gradually converge and approach the standard frequency value of the second measurement signal, such that the frequency of the reference clock signal is further corrected, and frequency output of the reference clock signal tends to a steady state.

In some embodiments, the gate time $T_3$ is greater than the gate time $T_2$, and the third step value is less than the second step value.

Figure 5:
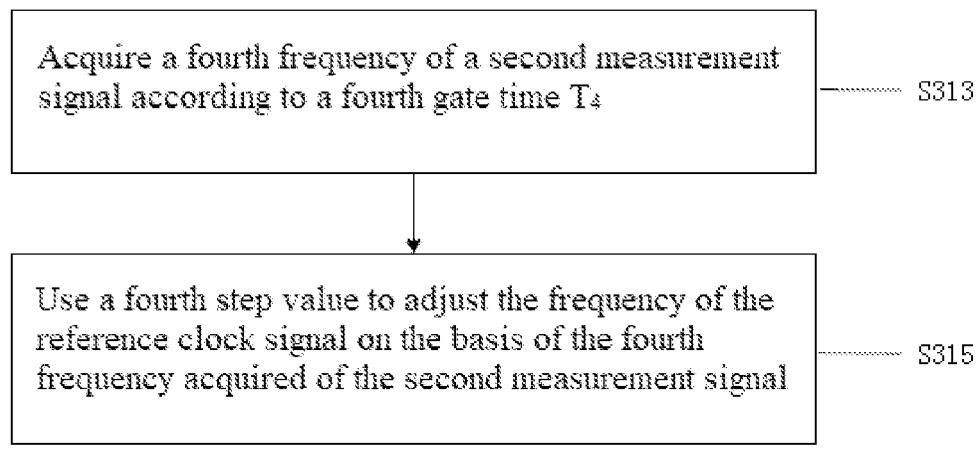
FIG. 5 is a flowchart of a real-time correction method for an oven controlled crystal oscillator provided in the present disclosure.

In some other embodiments, as shown in FIG. 5, after using a third step value to adjust the frequency of the reference clock signal until an absolute value of a difference between two adjacent third frequencies is not greater than a third standard frequency difference and an error of the third frequencies is not greater than a second accuracy error, the step of adjusting the frequency of the reference clock signal further includes:

S313, a fourth frequency of the second measurement signal is acquired according to a fourth gate time $T_4$.

It will be appreciated that the fourth frequency is a measurement frequency, corresponding to the fourth gate time $T_4$, of the second measurement signal and is determined based on Expression 1: $f_m$=counter/T.

S315, a fourth step value is used to adjust the frequency of the reference clock signal on the basis of the fourth frequency acquired of the second measurement signal.

In the embodiment of the present disclosure, the second measurement signal output in S311 is further adjusting according to S313 and S315, the fourth step value is used to adjust the frequency of the reference clock signal, and then frequency output of the reference clock signal tends to a steady state.

The gate time $T_4$ is greater than the gate time $T_3$, and the fourth step value is less than the third step value.

A specific usage scenario is used for exemplary description:

In this embodiment, an oven controlled crystal oscillator with a reference clock source frequency $f_0$=12.288 MHz is used, a phase-locked loop is configured to perform frequency multiplication on a reference clock signal output by the oven controlled crystal oscillator to generate a first measurement signal and a second measurement signal simultaneously, where the first measurement signal is subject to 5 times of frequency multiplication, that is, in $f_1=N_1f_0$, $N_1$ is 5, a frequency $f_1$ of the first measurement signal=61.44 MHz, the second measurement signal is subject to 20 times of frequency multiplication, that is, in $f_2=N_2f_0$, $N_2$ is 20, and a frequency $f_2$ of the second measurement signal=245.76 MHz.

According to the related art, the GNSS module is configured to receive satellite signals to generate a PPS, under the condition that the GNSS module receives the satellite signals sent by four or more navigation satellites, accurate geographic and time information may be provided, an error of the pulse per second output by the GNSS module is within 20 ns, and a rising time of a PPS module is about 8 ns.

Figure 6:
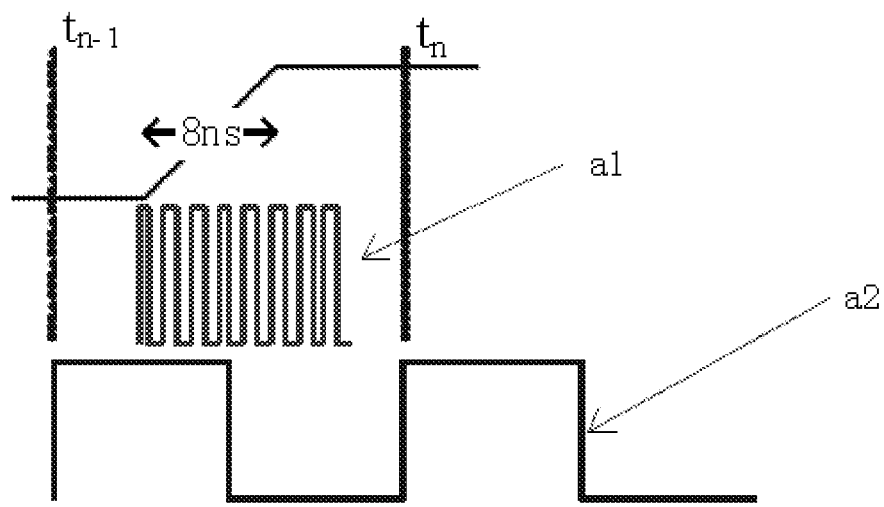
FIG. 6 is a schematic diagram for identification of a rising edge of PPS in related art.

Further, identifying a rising edge of the PPS is the key to generating a gate time, and logic of identification is to perform edge scanning on the GNSS module. FIG. 6 shows a rising edge identification schematic diagram in related art. As shown in FIG. 6, two continuous rising edges are scanned, the previous rising edge (time $t_{n-1}$) is swept to show a low level, and the current rising edge (time $t_n$) is swept to show a high level. With reference to scanning of the rising edge of the PPS by the frequency source in FIG. 6, an excessively fast frequency source is shown as $a_1$ in FIG. 6, in two continuous rising edges of the GNSS module, the excessively fast frequency source may not effectively identify the low level and the high level, and may further not effectively identify the rising edge of the PPS of the GNSS module. A too slow frequency source $a_2$ may effectively identify the rising edge of the PPS, but may cause an edge identification error.

In this embodiment of the present disclosure, the OCXO in the solution has an output frequency $f_0$ of 12.288 MHz and a period time of 81.38 ns, the phase-locked loop (PLL) is configured to perform 5 times of frequency multiplication and 20 times of frequency multiplication on the reference clock signal, then a first measurement signal with a frequency of 61.44 MHz ($5f_0$) and a period of 16.28 ns is obtained by means of 5 times of frequency multiplication, and a second measurement signal with a frequency of 245.76 MHz ($20f_0$) and a period of 4.07 ns is obtained by 20 times of frequency multiplication. The first measurement signal with 5 times of frequency multiplication serves as a frequency source for PPS rising edge scanning, and the period of the first measurement signal is 16.28 ns, 2.04 times of 8 ns of the rising edge of the PPS, such that the identification accuracy is ensured, and an error caused by identification is ensured to be in 8.28 (16.28−8) ns.

Figure 7:
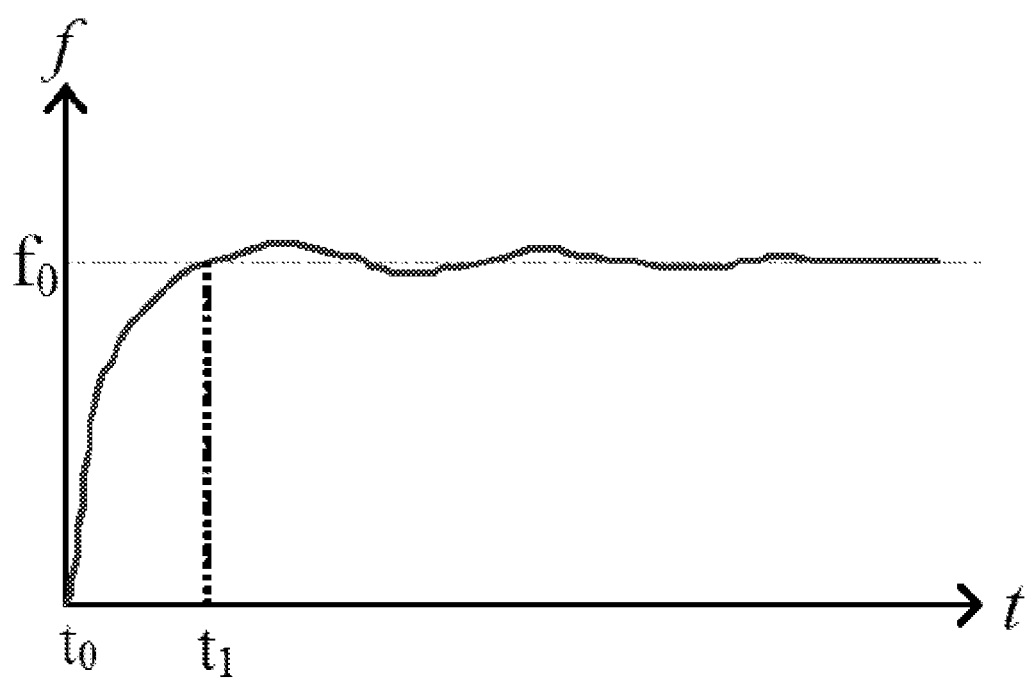
FIG. 7 is s characteristic diagram of an output frequency of an oven controlled crystal oscillator after power-on in the related art.

In the related art, as shown in FIG. 7, a variation of an output frequency f of the OCXO over time is shown in FIG. 7, $f_0$ is the frequency of the reference clock signal of the oven controlled crystal oscillator, and may also be said to be a reference clock source or nominal frequency of the oven controlled crystal oscillator. The OCXO is powered down within 1 minute and then powered on to become hot start, and the remaining is cold start. At a cold start power-on time to, the output f of the OCXO is lower than $f_0$, the output is generally about ($f_0$−200) Hz, as the increase of the power-on time, a temperature of a constant-temperature bath is gradually increased, and the output quickly approaches the nominal frequency $f_0$, for example, a time period from $t_0$ to $t_1$; and after the temperature of the constant-temperature bath is stable, the output is stable and approaches the nominal frequency $f_0$, for example, a time period after time $t_1$. The OCXO is started in a hot mode, a heating process of the constant-temperature bath is short, and the frequency output quickly approaches the nominal frequency $f_0$. In the time period from $t_0$ to $t_1$, the OCXO does not reach a steady state, the frequency output is too low, under the condition that frequency measurement is performed and a voltage control pin of the OCXO is debugged in the time period, if the output frequency needs to be higher, voltage of the voltage control pin needs to be increased, resulting in over-adjusting, that is, frequency output converging may not be achieved by adjusting the voltage control pin of the OCXO in the period of time.

In this embodiment of the present disclosure, three different gate times of 10 s, 50 s and 100 s are set, and a second measurement signal with the gate time of 10 s is equivalent to 200 times of the frequency of the OCXO. By analogy, the second measurement signal at the gate time of 50 s is equivalent to 1000 times of the frequency of the OCXO, and the second measurement signal at the gate time of 100 s is equivalent to 2000 times of the frequency of the OCXO. The OCXO is subjected to voltage control pin control with different steps at the same gate time of 10 s, 50 s and 100 s respectively.

Figures 9, 10:
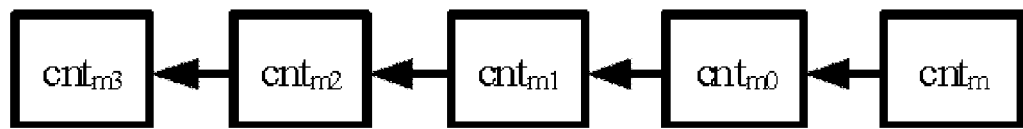
FIG. 9 is a structural schematic diagram of a storage unit of an electromagnetic receiver provided in the present disclosure.
FIG. 10 is a schematic diagram of a computation principle of FIG. 9.

In the solution, as shown in FIGS. 9-10, a frequency meter and a shift register (FIG. 9) are designed, the frequency meter is configured to count the frequency of the second measurement signal in each gate time, and an absolute value of a difference between two adjacent frequency measurement of the second measurement signal is computed according to Expressions 2, 3, 4 and 5 of FIG. 10; and the shift register is configured to cache results of continuous times of the frequency meter, and the absolute value of the difference between the two adjacent frequency measurement of the second measurement signal reflects output stability of the OCXO, and the stability of the frequency output of the OCXO is determined according to the plurality of continuous caching results and a current measurement value.

With reference to FIG. 7, during the time period from $t_0$-$t_1$, the output of the OCXO grows rapidly, an absolute value of a difference between two adjacent frequencies of the second measurement signal is larger, and after time $t_1$, an absolute value of a difference between two adjacent frequencies of the second measurement signal is smaller and more stable. A counting result cache of the shift register is shown in FIG. 9, the shift register includes, but is not limited to, five storage units, and the embodiment of the present disclosure is exemplified by five storage units, that is, a first storage unit to a fifth storage unit from right to left. The shift register meets a first-in-first-out storage rule, that is, the first storage unit is used for initial storage, the measurement values of the second measurement signal are sequentially shifted leftwards according to a sequence from the first storage unit to the fifth storage unit, it may be understood that sequential leftwards shifting indicates sequential assignment, and it may also be said that the first storage unit is configured to storing a latest value of the second measurement signal, a last stored value is stored in the second storage unit, and an oldest value is stored in the fifth storage unit.

Specifically, the five storage units may store five measurement values of the second measurement signal, two adjacent measurement values of the second measurement signal participate in difference operation, and the five measurement values of the second measurement signal meet the four times of difference operation. On the basis that the absolute value of the difference between two adjacent measurement values of the second measurement signal is greater than the standard frequency difference, cyclic comparison is carried out, and cache data farthest away from the current measurement time of the second measurement signal is moved out from the fifth storage unit, such that the latest measurement value of the second measurement signal participates in determination. A time required by different OCXOs to reach a stable frequency of $t_1$ is inconsistent, compared with a mode that after waiting for the time of $t_1$, the OCXO are adjusted, the determination method in the solution may quickly make output of the clock source of the oven controlled crystal oscillators to tend to a steady state, and therefore, the method has high response speed and strong adaptability.

With continued reference to FIG. 9, a measurement frequency of the second measurement signal is determined based on $f_m$=counter/T, $cnt_m$, $cnt_{m0}$, $cnt_{m1}$, $cnt_{m2}$, and $cnt_{m3}$ represent measurement values of $f_m$ at different time periods respectively, the measurement value of the second measurement signal stored in the first storage unit is represented by $cnt_m$, the measurement value of the second measurement signal stored in the second storage unit is represented by $cnt_{m0}$, the measurement value of the second measurement signal stored in the third storage unit is represented by $cnt_{m1}$, the measurement value of the second measurement signal stored in the fourth storage unit is represented by $cnt_{m2}$, and the measurement value of the second measurement signal stored in the fifth storage unit is represented by $cnt_{m3}$. In the sequence from the first storage unit to the fifth storage unit, $cnt_{m3}$ is the oldest measurement value, and $cnt_m$ is the latest measurement value. Expression 2: $\Delta cnt_0 = |cnt_{m0} - cnt_m|$, where $\Delta cnt_0$ is an absolute value of a difference between the measurement value of the second measurement signal stored in the second storage unit and the measurement value of the second measurement signal stored in the first storage unit. Expression 3: $\Delta cnt_1 = |cnt_{m1} - cnt_{m0}|$, where $\Delta cnt_1$ is an absolute value of a difference between the measurement value of the second measurement signal stored in the third storage unit and the measurement value of the second measurement signal stored in the second storage unit. Expression 4: $\Delta cnt_2 = |cnt_{m2} - cnt_{m1}|$, where $\Delta cnt_2$ is an absolute value of a difference between the measurement value of the second measurement signal stored in the fourth storage unit and the measurement value of the second measurement signal stored in the third storage unit. Expression 5: $\Delta cnt_3 = |cnt_{m3} - cnt_{m2}|$, where $\Delta cnt_3$ is an absolute value of a difference between the measurement value of the second measurement signal stored in the fifth storage unit and the measurement value of the second measurement signal stored in the fourth storage unit.

Figure 8:
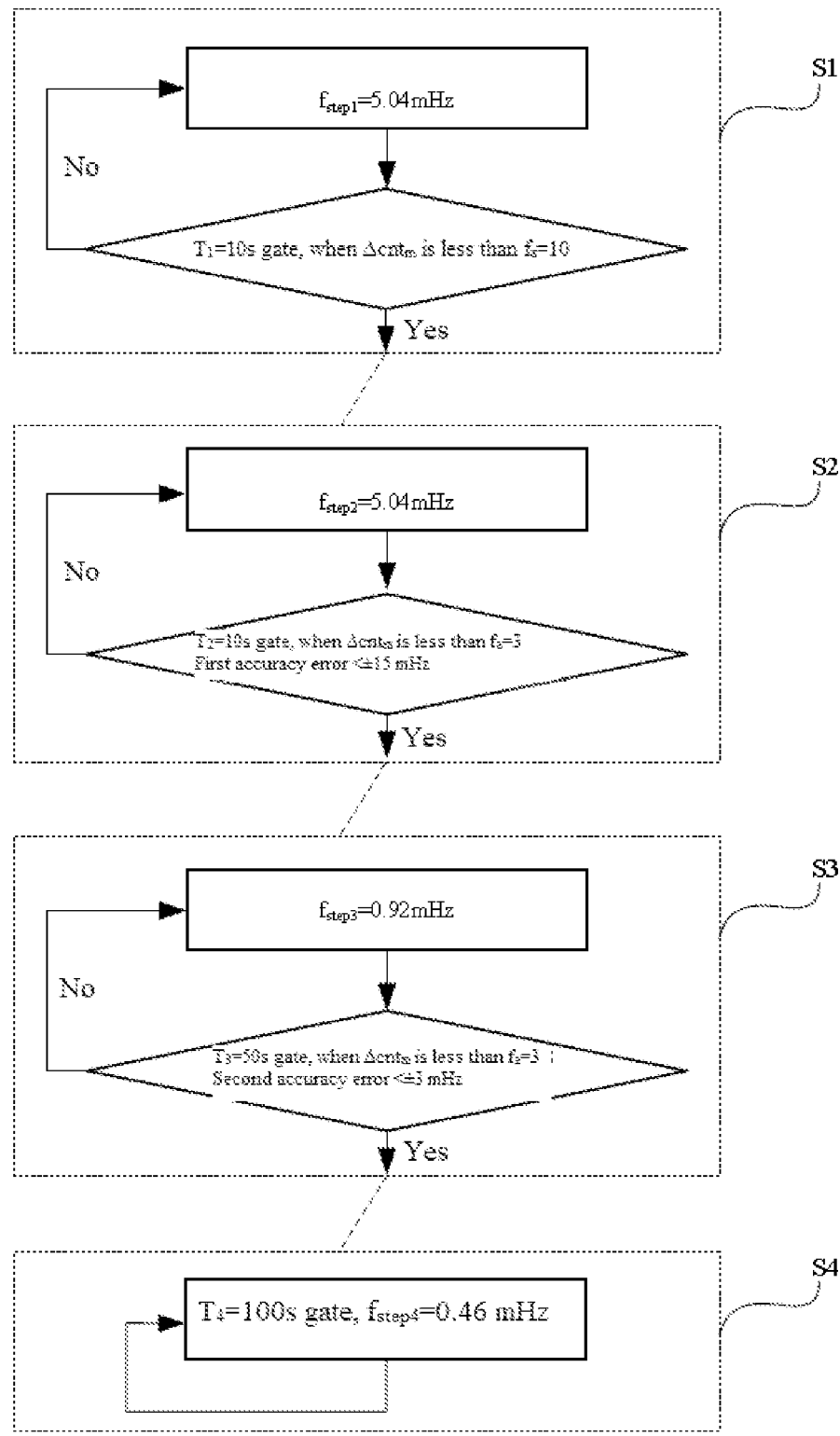
FIG. 8 is a flowchart of a state machine of the oven controlled crystal oscillator provided in the present disclosure.

This embodiment is specifically described in conjunction with a corrective state machine as shown in FIG. 8.

S1: a plurality of first frequencies of the second measurement signal are acquired according to a first gate time $T_1$. It will be appreciated that each first frequency is a measurement frequency, corresponding to the first gate time $T_1$, of the second measurement signal and is determined based on Expression 1: $f_m$=counter/T. The plurality of first frequencies are acquired based on a plurality of continuous first gate times $T_1$. $T=T_1$, the first gate time $T_1$ is 10 s, counter is a count value, and $f_m$ is a first frequency.

A first step value is used to adjust the frequency of the reference clock signal on the basis that an absolute value of a difference between two adjacent first frequencies is greater than a first standard frequency difference.

Specifically, the step of comparing the absolute value of the difference between the two adjacent first frequencies with the first standard frequency difference includes that with reference to FIG. 9, in the first first gate time $T_1$, the first frequency acquired is shifted leftwards to a leftmost end, it may also be understood as that the first frequency is cached in the fifth storage unit by means of four consecutive times of assignment, and $cnt_{m3}$ is used for representing the first frequency in the fifth storage unit. The first frequency obtained at the second first gate time $T_1$ is cached in the fourth storage unit, and $cnt_{m2}$ is used for representing the first frequency in the fourth storage unit. The first frequency obtained at the third first gate time $T_1$ is cached in the third storage unit, and $cnt_{m1}$ is used for representing the first frequency in the third storage unit. The first frequency obtained at the fourth first gate time $T_1$ is cached in the second storage unit, and $cnt_{m0}$ is used for representing the first frequency in the second storage unit. The first frequency obtained at the fifth first gate time $T_1$ is cached in the first storage unit, and $cnt_m$ is used for representing the first frequency in the fifth storage unit.

The absolute value of the difference between two adjacent first frequencies is computed based on Expressions 2, 3, 4 and 5, and a specific computation mode has been described in the above embodiment and is not repeated. The absolute value of the difference computed by using Expressions 2, 3, 4, and 5 is compared with the first standard frequency difference, where $\Delta cnt_m$ is used for representing the absolute value of the difference, and m≥0.

Further, the absolute value of the difference between the two first frequencies of the two continuous first gate times $T_1$ participates in the first comparison (the absolute value of the difference computed based on Expression 5 participates in the first comparison), and a first step value is used to adjust the frequency of the reference clock signal under the condition that the absolute value of the difference between the two adjacent first frequencies is greater than the first standard frequency difference. After adjustment, in a third gate time $T_1$, one first frequency is correspondingly obtained a difference between the first frequency of the second first gate time $T_1$ and the first frequency of the third first gate time $T_1$ is made (the absolute value of the difference computed based on Expression 4 participates in the second comparison), and an absolute value of the difference is compared with the first standard frequency difference.

By analogy, cyclic comparison is performed until the absolute value of the difference between the two adjacent first frequencies is not greater than the first standard frequency difference, and the first step value is not used to adjust the frequency of the reference clock signal any more. It will be appreciated that, based on a state machine S1, the first frequencies of the second measurement signal gradually converge and gradually approach a standard frequency value of the second measurement signal, which is determined based on a conditional expression $f_2=N_2f_0$. $f_2=2457600000$ Hz (245.76 MHz*10 s), $f_2$ has a variation confidence interval of ±10 and a variation error of ±50 mHz for measurement results at two adjacent sides, for achieving a relative variation in 50 mHz, an adjusted first step value is 5.04 mHz (that is, the first step value is about one tenth of the accuracy), and $f_{step1}$ is used for representing the first step value.

The first standard frequency difference is determined based on a conditional expression of the standard frequency difference: $f_a=bN_2T$, where the gate time $T=T_1$, that is, $T_1=10$, $N_2=20$, $b=50$ mHz (millihertz) (b is a stability error has a value determined by the stability of the target output frequency, and the stability of the output frequency achieved in stage S1 is less than 4.07E-9), and the value of $f_a$ is 10.

In the embodiment of the present disclosure, on one hand, the frequency output of the OCXO may be preliminarily subjected to stability determination analysis according to effective identification of the pulse per second by the first measurement signal and based on a comparison of the absolute value of the difference between the two adjacent first frequencies with the first standard frequency difference; and on the other hand, on the basis that the absolute value of the difference between the two adjacent first frequencies is greater than the first standard frequency difference, and the first step value is used to adjust the frequency of the reference clock signal until the first frequencies of the second measurement signal gradually converge and approach the standard frequency value of the second measurement signal, that is, the frequency of the reference clock signal is corrected.

S2: a plurality of second frequencies of the second measurement signal are acquired according to a second gate time $T_2$.

It will be appreciated that each second frequency is a measurement frequency, corresponding to the second gate time $T_2$, of the second measurement signal and is determined based on Expression 1: $f_m$=counter/T. The plurality of second frequencies are acquired based on a plurality of continuous second gate times $T_2$. $T=T_2$, the second gate time $T_2$ is 10 s, counter is a count value, and $f_m$ is a second frequency.

A second step value is used to adjust the frequency of the reference clock signal on the basis that an absolute value of a difference between two adjacent second frequencies is greater than a second standard frequency difference and an error of the second frequencies is greater than a first accuracy error.

Specifically, the step of comparing the absolute value of the difference between the two adjacent second frequencies with the second standard frequency difference and comparing the error of the second frequencies with the first accuracy error includes that with reference to FIG. 9, in the first second gate time $T_2$, the second frequency acquired is shifted leftwards to a leftmost end, it may also be understood as that the second frequency is cached in the fifth storage unit by means of four consecutive times of assignment, and $cnt_{m3}$ is used for representing the second frequency in the fifth storage unit. The second frequency obtained at the second second gate time $T_2$ is cached in the fourth storage unit, and $cnt_{m2}$ is used for representing the second frequency in the fourth storage unit. The second frequency obtained at the third second gate time $T_2$ is cached in the third storage unit, and $cnt_{m1}$ is used for representing the second frequency in the third storage unit. The second frequency obtained at the fourth second gate time $T_2$ is cached in the second storage unit, and $cnt_{m0}$ is used for representing the second frequency in the second storage unit. The second frequency obtained at the fifth second gate time $T_2$ is cached in the first storage unit, and $cnt_m$ is used for representing the second frequency in the fifth storage unit.

The absolute value of the difference between two adjacent second frequencies is computed based on Expressions 2, 3, 4 and 5, and a specific computation mode has been described in the above embodiment and is not repeated. The absolute value of the difference computed by using Expressions 2, 3, 4, and 5 is compared with the second standard frequency difference. The first accuracy error is determined by the second gate time $T_2$, and the first accuracy error is used for representing an error range between the second frequency of the second measurement signal and the standard frequency of the second measurement signal.

Further, the absolute value of the difference between the two second frequencies of the two continuous second gate times $T_2$ participates in the first comparison (the absolute value of the difference computed based on Expression 5 participates in the first comparison), and the second step value is used to adjust the frequency of the reference clock signal under the conditions that the absolute value of the difference between the two adjacent second frequencies is greater than the second standard frequency difference and an error of the second frequencies (a difference between $cnt_{m3}$ and the standard frequency value of the second measurement signal, and a difference between $cnt_{m2}$ and the standard frequency value of the second measurement signal) is greater than a first accuracy error. After adjustment, in a third gate time $T_2$, one second frequency is correspondingly obtained. A difference between the second frequency of the second second gate time $T_2$ and the second frequency of the third second gate time $T_2$ is made (the absolute value of the difference computed based on Expression 4 participates in the second comparison), an absolute value of the difference is compared with the second standard frequency difference, and an error of the second frequency of the third second gate time $T_2$ (a difference between $cnt_{m1}$ and the standard frequency value of the second measurement signal) is compared with the first accuracy error.

By analogy, cyclic comparison is performed until the absolute value of the difference between the two adjacent second frequencies is not greater than the second standard frequency difference and the error of the second frequencies is not greater than the first accuracy error, and the second step value is not used to adjust the frequency of the reference clock signal any more. It will be appreciated that, based on a state machine S2, the second frequencies of the second measurement signal gradually converge and gradually approach a standard frequency value of the second measurement signal, which is determined based on a conditional expression $f_2=N_2f_0$. $f_2=2457600000$ Hz (245.76 MHz*10 s), $f_2$ has a confidence interval of 2457600000 Hz±3 and a first accuracy error of ±15 mHz, for achieving the accuracy of 15 mHz, an adjusted second step value is 5 mHz (that is, the second step value is about one third of the accuracy), and $f_{step2}$ is used for representing the second step value.

The second standard frequency difference is determined based on the conditional expression of the standard frequency difference:

$f_a=bN_2T$, where the gate time $T=T_1$, that is, $T_1=10$, $N_2=20$, $b=15$ mHz (millihertz) (b is a stability error has a value determined by the stability of the target output frequency, and the stability of the output frequency achieved in stage S2 is less than 1.22E-9), and the value of $f_a$ is 3.

In the embodiment of the present disclosure, the second measurement signal output in state machine S1 is further adjusting according to state machine S2, and based on comparison that the absolute value of the difference between the two adjacent second frequencies is greater than the second standard frequency difference and the error of the second frequencies is not greater than the first accuracy error, the second step value is used to adjust the frequency of the reference clock signal until the second frequencies of the second measurement signal gradually converge and approach the standard frequency value of the second measurement signal, such that the frequency of the reference clock signal is further corrected, and frequency output of the reference clock signal tends to a steady state.

S3: a plurality of third frequencies of the second measurement signal are acquired according to a third gate time $T_3$.

It will be appreciated that each third frequency is a measurement frequency, corresponding to the third gate time $T_3$, of the second measurement signal and is determined based on Expression 1: $f_m$=counter/T. The plurality of third frequencies are acquired based on a plurality of continuous third gate times $T_3$. $T=T_3$, the third gate time $T_3$ is 50 s, counter is a count value, and $f_m$ is a third frequency.

A third step value is used to adjust the frequency of the reference clock signal on the basis that an absolute value of a difference between two adjacent third frequencies is greater than a third standard frequency difference and an error of the third frequencies is greater than a second accuracy error.

Specifically, the step of comparing the absolute value of the difference between the two adjacent third frequencies with the third standard frequency difference and comparing the error of the third frequencies with the second accuracy error includes that with reference to FIG. 9, in the first third gate time $T_3$, the third frequency acquired is shifted leftwards to a leftmost end, it may also be understood as that the third frequency is cached in the fifth storage unit by means of four consecutive times of assignment, and $cnt_{m3}$ is used for representing the third frequency in the fifth storage unit. The third frequency obtained at the second third gate time $T_3$ is cached in the fourth storage unit, and $cnt_{m2}$ is used for representing the third frequency in the fourth storage unit. The third frequency obtained at the third third gate time $T_3$ is cached in the third storage unit, and $cnt_{m1}$ is used for representing the third frequency in the third storage unit. The third frequency obtained at the fourth third gate time $T_3$ is cached in the second storage unit, and $cnt_{m0}$ is used for representing the third frequency in the second storage unit. The third frequency obtained at the fifth third gate time $T_3$ is cached in the first storage unit, and $cnt_m$ is used for representing the third frequency in the fifth storage unit.

The absolute value of the difference between two adjacent third frequencies is computed based on Expressions 2, 3, 4 and 5, and a specific computation mode has been described in the above embodiment and is not repeated. The absolute value of the difference computed by using Expressions 2, 3, 4, and 5 is compared with the third standard frequency difference. The second accuracy error is determined by the third gate time $T_3$, and the second accuracy error is used for representing an error range between the third frequency of the second measurement signal and the standard frequency of the second measurement signal.

Further, the absolute value of the difference between the two third frequencies of the two continuous third gate times $T_3$ participates in the first comparison (the absolute value of the difference computed based on Expression 5 participates in the first comparison), and the third step value is used to adjust the frequency of the reference clock signal under the conditions that the absolute value of the difference between the two adjacent third frequencies is greater than the third standard frequency difference and an error of the third frequencies (a difference between $cnt_{m3}$ and the standard frequency value of the second measurement signal, and a difference between $cnt_{m2}$ and the standard frequency value of the second measurement signal) is greater than a second accuracy error. After adjustment, in a third gate time $T_3$, one third frequency is correspondingly obtained. A difference between the third frequency of the second third gate time $T_3$ and the third frequency of the third third gate time $T_3$ is made (the absolute value of the difference computed based on Expression 4 participates in the second comparison), an absolute value of the difference is compared with the third standard frequency difference, and an error of the third frequency of the third third gate time $T_3$ (a difference between $cnt_{m1}$ and the standard frequency value of the second measurement signal) is compared with the second accuracy error.

By analogy, cyclic comparison is performed until the absolute value of the difference between the two adjacent third frequencies is not greater than the third standard frequency difference and the error of the third frequencies is not greater than the second accuracy error, and the third step value is not used to adjust the frequency of the reference clock signal any more. It will be appreciated that, based on a state machine S3, the third frequencies of the second measurement signal gradually converge and gradually approach the standard frequency value of the second measurement signal, which is determined based on a conditional expression $f_2=N_2f_0$. $f_2=12288000000$ Hz (245.76 MHz*50 s), $f_2$ has a confidence interval of 12288000000 Hz±3 and a second accuracy error of ±3 mHz, for achieving the accuracy of 3 mHz, an adjusted third step value is 0.92 mHz (that is, the third step value is about one third of the second accuracy error), and $f_{step3}$ is used for representing the third step value.

The third standard frequency difference is determined based on a conditional expression of the standard frequency difference:

$f_a=bN_2T$, where the gate time $T=T_1$, that is, $T_1=50$, $N_2=20$, b=3 mHz (millihertz) (b is a stability error has a value determined by the stability of the target output frequency, and the stability of the output frequency achieved in stage S3 is less than 2.44E-10), and the value of $f_a$ is 3.

In the embodiment of the present disclosure, the second measurement signal output in state machine S2 is further adjusting according to state machine S3, and based on comparison that the absolute value of the difference between the two adjacent third frequencies is greater than the third standard frequency difference and the error of the third frequencies is not greater than the second accuracy error, the third step value is used to adjust the frequency of the reference clock signal until the third frequencies of the second measurement signal gradually converge and approach the standard frequency value of the second measurement signal, such that the frequency of the reference clock signal is further corrected, and frequency output of the reference clock signal tends to a steady state.

S4: A fourth frequency of the second measurement signal is acquired according to a fourth gate time $T_4$.

It will be appreciated that the fourth frequency is a measurement frequency, corresponding to the fourth gate time $T_4$, of the second measurement signal and is determined based on Expression 1: $f_m$=counter/T. T=$T_4$, the fourth gate time $T_4$ is 100 s, counter is a count value, and $f_m$ is a fourth frequency.

The fourth step value is used to adjust the frequency of the reference clock signal on the basis of the fourth frequency acquired of the second measurement signal. $f_2=24576000000$ Hz (245.76 MHz*100 s), an adjusted fourth step value is 0.46 mHz, and $f_{step4}$ is used for representing the fourth step value.

In the embodiment of the present disclosure, the second measurement signal output in state machine S3 is further adjusting according to state machine S4, the fourth step value is used to adjust the frequency of the reference clock signal, then frequency output of the reference clock signal tends to a steady state, and a high-precision reference clock signal is output.

In some embodiments, the frequency of the reference clock signal is turned down by one step by using the fourth step value when the count is greater than counter, and the frequency of the reference clock signal is turned up by one step by using the fourth step value when the count is less than counter, such that the frequency adjustment stability of the second measurement signal is less than 3.75 E-11 (0.46 mHz/12.288 MHz≈3.74 E-11).

In this embodiment of the present disclosure, in each state switching of the state machines S1 to S3, the frequency output accuracy of the oven controlled crystal oscillator is increased progressively, and the step value for adjusting a digital-analog converter (DAC) module is decreased progressively, such that the frequency adjustment precision of the oven controlled crystal oscillator is ensured, and a steady-state adjustment speed is accelerated.

In the second aspect of the present disclosure, the present disclosure provides an electromagnetic receiver, including a frequency multiplication unit, an identification unit, a statistical unit an a correction sub-module. The frequency multiplication unit is configured to perform frequency multiplication on a reference clock signal to generate a first measurement signal and second measurement signals.

Specifically, the frequency multiplication unit is a frequency multiplier, the frequency multiplier is configured to perform frequency multiplication on the reference clock signal to generate the first measurement signal and the second measurement signal, the first measurement signal and the second measurement signal have different frequency multiplication coefficients, and the frequency multiplication coefficient of the second measurement signal is greater than that of the first measurement signal. The frequency multiplier is a phase-locked loop.

The identification unit is configured to identify a rising edge of each pulse per second (PPS) on the basis of the first measurement signal to obtain a gate time T.

Specifically, the identification unit uses the first measurement signal to identify the rising edge of each PPS, and a time length for exiting the gate times T is determined according to a rising edge identification result of the plurality of PPS.

The statistical unit is configured to obtain a frequency of the second measurement signal according to the gate time T. The frequencies of the second measurement signal are the multiplied frequency of the reference clock signal, based on the determined gate time T, a measured second measurement signal is counted in one gate time T by using a frequency meter to obtain a count value counter of the measured second measurement signal, and the frequency of the measured second measurement signal may be computed by Expression 1: $f_m$=counter/T, where $f_m$ is expressed as the frequency of the second measurement signal.

The correction sub-module is configured to adjust a frequency of the reference clock signal at least on the basis that an absolute value of a difference between frequencies of two adjacent obtained second measurement signals is greater than a standard frequency difference. The reference clock signal is generated by an oven controlled crystal oscillator of an electromagnetic receiver.

Based on at least two gate times T and Expression 1: $f_m$=counter/T, the correction sub-module computes two frequency measurement values of the second measurement signal corresponding to two adjacent gate times T, a difference between the two frequency measurement values of the adjacent second measurement signal is made, and the frequency of the reference clock signal is adjusted based on a comparison result that the absolute value of the difference between the two frequencies of the second measurement signal is greater than the standard frequency difference. The standard frequency difference is determined according to the frequency multiplication coefficient of the second measurement signal, the gate time T and a measurement error.

In one aspect of the embodiment of the present disclosure, the frequency multiplication unit performs frequency multiplication on the reference clock signal to generate a first measurement signal and a second measurement signal with different frequencies, and the frequency of the second measurement signal is higher, such that a gate time for measurement is equivalently improved, and measurement precision is improved; in another aspect, a frequency of the first measurement signal is a multiplied frequency of the reference clock signal, the identification unit may effectively guarantee identification of a rising edge of PPS, so as to effectively solve the problem about identification of the rising edge of PPS; and in yet another aspect, the correction sub-module observes an absolute value of a difference between two or more frequencies of the second measurement signal and compares the absolute value of the difference between the frequencies of the second measurement signal with a standard frequency difference, whether current output of oven controlled crystal oscillator is stable may be known, and the frequency of the reference clock signal may also be adjusted.

Figure 11:
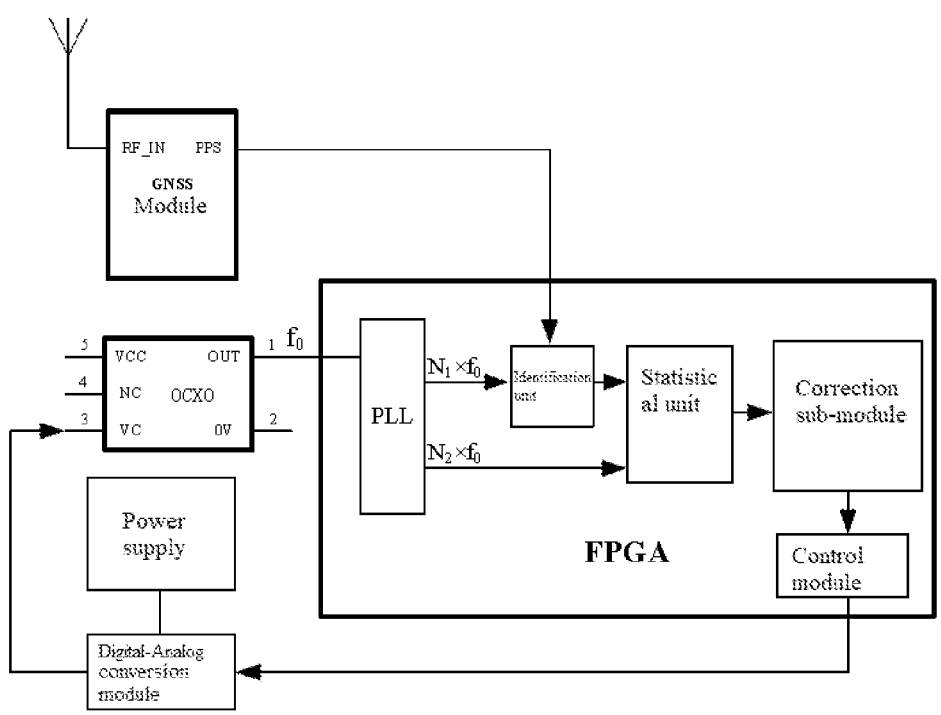
FIG. 11 is a structural schematic diagram of the electromagnetic receiver provided in the present disclosure.

FIG. 11 shows a structural diagram of the embodiment of the present disclosure. The electromagnetic receiver includes a GNSS module, an OCXO, a field-programmable gate array (FPGA) module, a control module and a digital-analog conversion module. The GNSS module is configured to receive satellite signals of navigation satellites and generate a pulse per second according to the satellite signals. The oven controlled crystal oscillator is configured to provide a reference clock source and transmit a reference clock signal on the basis of the reference clock source. The FPGA module is connected to the GNSS module and the oven controlled crystal oscillator, and the FPGA module includes a frequency multiplication unit, a statistical unit, an identification unit, a storage unit and a correction sub-module. The frequency multiplication unit is a PLL, the statistical unit is a frequency meter, and the storage unit is a shift register. An input of the phase-locked loop is connected to an output of the oven controlled crystal oscillator, a first output of the phase-locked loop is connected to an input of the identification unit, a second output of the phase-locked loop is connected to an input of the frequency meter, an output of the frequency meter is connected to an input of the storage unit, and an output of the storage unit (not shown in the figure) is connected to an input of the correction sub-module.

The phase-locked loop is configured to perform frequency multiplication on the reference clock signal to generate a first measurement signal and a second measurement signal, the identification unit identifies a rising edge of each pulse per second of the GNSS module on the basis of the first measurement signal to generate a gate time T, the frequency meter is configured to count the second measurement signal in the gate time T, each frequency value of the second measurement signal counted by the frequency meter is stored in the storage unit, and the correction sub-module extracts the frequency measurement value corresponding to each second measurement signal stored in the storage unit and outputs a step value at least on the basis that an absolute value of a difference between two adjacent frequencies of the second measurement signal is larger than a standard frequency difference.

An input end of the control module is connected to an output end of the correction sub-module, and the control module outputs a voltage control signal according to the step value. The digital-analog conversion module is connected to an output end of the control module, an output end of the digital-analog conversion module is connected to a control end of the oven controlled crystal oscillator, and the analog-analog converter module is configured to convert the voltage-controlled signal into an analog voltage-controlled voltage so as to adjust the frequency of the reference clock signal.

Further, the navigation satellites constitute a navigation system, the navigation system with four or more navigation satellites may provide accurate geographic and time information to a surface of the earth or a near-earth surface, and the satellite signals of the navigation satellites are acquired by means of the GNSS module. The GNSS module generates the PPS on the basis of the acquired satellite signals, the PPS having long-term stability.

The OCXO is configured to provide a reference clock source, the OCXO uses a constant temperature device to keep a temperature of a quartz crystal resonator stable and reduces the amount of variation, caused by a surrounding temperature variation, of an output frequency of the oscillator, the OCXO is usually provided with a voltage control pin for adjusting a temperature of the constant temperature device, so as to control the output frequency of the OCXO, and then the frequency output of the OCXO has short-term stability. The OCXO transmits the reference clock signal on the basis of the reference clock source.

In some embodiments, the frequency multiplication unit performs frequency multiplication on the reference clock signal according to a conditional expression $f_1=N_1 f_0$ to obtain the first measurement signal, where $f_0$ is the frequency of the reference clock signal, $f_1$ is a frequency of the first measurement signal, and $N_1$ is a positive integer. The frequency multiplication unit performs frequency multiplication on the reference clock signal according to a conditional expression $f_2=N_2 f_0$ to obtain the second measurement signal, where $f_2$ is the frequencies of the second measurement signal, and $N_2$ is a positive integer. A value of the frequency $f_0$ of the reference clock signal ranges from 5 MHz to 50 MHz, the frequency $f_1$ of the first measurement signal≤62.5 MHz, the positive integer $N_2=nN_1$, and $4 \leq n \leq 16$.

Further, a standard frequency difference satisfies a conditional expression: $f_a=bN_2T$, where $f_a$ is the standard frequency difference, b is a stability error, $N_2$ is a frequency multiplication coefficient of the second measurement signal, and T is a gate time.

In some other embodiments, the correction sub-module includes a first correction unit, and the first correction unit includes a first acquisition sub-unit and a first adjustment sub-unit.

The first acquisition sub-unit acquires a plurality of first frequencies of the second measurement signal according to a first gate time $T_1$. It will be appreciated that each first frequency is a measurement frequency, corresponding to the first gate time $T_1$, of the second measurement signal and is determined based on Expression 1: $f_m$=counter/T. The plurality of first frequencies are acquired based on a plurality of continuous first gate times $T_1$. Further, counter is a count value, $f_m$ is a frequency measurement value, and T is gate time.

The first adjustment sub-unit is configured to use a first step value to adjust the frequency of the reference clock signal on the basis that an absolute value of a difference between two adjacent first frequencies is greater than a first standard frequency difference.

Specifically, the step of comparing the absolute value of the difference between the two adjacent first frequencies with the first standard frequency difference includes correspondingly acquiring one first frequency in the first first gate time $T_1$, and correspondingly obtaining one first frequency in the second first gate time $T_1$.

Further, the absolute value of the difference between the two first frequencies of the two continuous first gate times $T_1$ participates in the first comparison, and a first step value is used to adjust the frequency of the reference clock signal under the condition that the absolute value of the difference between the two adjacent first frequencies is greater than the first standard frequency difference. After adjustment, in a third gate time $T_1$, one first frequency is correspondingly obtained. A difference between the first frequency of the second first gate time $T_1$ and the first frequency of the third first gate time $T_1$ is made, and an absolute value of the difference is compared with the first standard frequency difference.

By analogy, cyclic comparison is performed until the absolute value of the difference between the two adjacent first frequencies is not greater than the first standard frequency difference, and the first step value is not used to adjust the frequency of the reference clock signal any more. It will be appreciated that, based on the first adjustment sub-unit, the first frequencies of the second measurement signal gradually converge and gradually approach a standard frequency value of the second measurement signal, which is determined based on a conditional expression $f_2=N_2f_0$.

The first standard frequency difference is determined based on a conditional expression of the standard frequency difference: $f_a=bN_2T$, where the gate time $T=T_1$.

In the embodiment of the present disclosure, on one hand, the frequency output of the OCXO may be preliminarily subjected to stability determination analysis according to effective identification of the pulse per second by the identification unit using the first measurement signal and according to a comparison of the absolute value of the difference between the two adjacent first frequencies with the first standard frequency difference by the first correction unit. On the other hand, according to the first adjustment sub-unit, and on the basis that the absolute value of the difference between the two adjacent first frequencies is greater than the first standard frequency difference, and the first step value is used to adjust the frequency of the reference clock signal until the first frequencies of the second measurement signal gradually converge and approach the standard frequency value of the second measurement signal, that is, the frequency of the reference clock signal is corrected. In some embodiments, the correction sub-module further includes a second correction unit, and the second correction unit includes a second acquisition sub-unit and a second adjustment sub-unit.

The second acquisition sub-unit is configured to acquire second frequencies of the plurality of second measurement signals according to a second gate time $T_2$.

It will be appreciated that each second frequency is a measurement frequency, corresponding to the second gate time $T_2$, of the second measurement signal and is determined based on Expression 1: $f_m=\text{counter}/T$. The plurality of second frequencies are acquired based on a plurality of continuous second gate times $T_2$.

The second adjustment sub-unit is configured to use a second step value to adjust the frequency of the reference clock signal on the basis that an absolute value of a difference between two adjacent second frequencies is greater than a second standard frequency difference and an error of the second frequencies is greater than a first accuracy error.

Specifically, the step of comparing the absolute value of the difference between the two adjacent second frequencies with the second standard frequency difference and comparing the error of the second frequencies with the first accuracy error includes correspondingly acquiring one second frequency in the first second gate time $T_2$, and correspondingly acquiring one second frequency in the second second gate time $T_2$. The first accuracy error is determined by the second gate time $T_2$, and the first accuracy error is used for representing an error range between the second frequency of the second measurement signal and the standard frequency of the second measurement signal.

Further, the absolute value of the difference between the two second frequencies of the two continuous second gate times $T_2$ participates in the first comparison, and the second step value is used to adjust the frequency of the reference clock signal under the conditions that the absolute value of the difference between the two adjacent second frequencies is greater than the second standard frequency difference and an error of the second frequencies is greater than a first accuracy error. After adjustment, in a third gate time $T_2$, one second frequency is correspondingly obtained. A difference between the second frequency of the second second gate time $T_2$ and the second frequency of the third second gate time $T_2$ is made, an absolute value of the difference is compared with the second standard frequency difference, and an error of the second frequency of the third second gate time $T_2$ is compared with the first accuracy error.

By analogy, cyclic comparison is performed until the absolute value of the difference between the two adjacent second frequencies is not greater than the second standard frequency difference and the error of the second frequencies is not greater than the first accuracy error, and the second step value is not used to adjust the frequency of the reference clock signal any more. It will be appreciated that, based on the second adjustment sub-unit, the second frequencies of the second measurement signal gradually converge and gradually approach a standard frequency value of the second measurement signal, which is determined based on a conditional expression $f_2=N_2f_0$.

The second standard frequency difference is determined based on the conditional expression of the standard frequency difference: $f_a=bN_2T$, where the gate time $T=T_2$.

In the embodiment of the present disclosure, the second measurement signal output by the first correction unit is further adjusting according to the second correction unit, according to the second adjustment sub-unit and based on comparison that the absolute value of the difference between the two adjacent second frequencies is greater than the second standard frequency difference and the error of the second frequencies is not greater than the first accuracy error, the second step value is used to adjust the frequency of the reference clock signal until the second frequencies of the second measurement signal gradually converge and approach the standard frequency value of the second measurement signal, such that the frequency of the reference clock signal is further corrected, and frequency output of the reference clock signal tends to a steady state.

In some embodiments, the gate time $T_2$ is equal to the gate time $T_1$, and the second step value is equal to the first step value.

In some other embodiments, the correction sub-module further includes a third correction unit, and the third correction unit includes a third acquisition sub-unit and a third adjustment sub-unit.

The third acquisition sub-unit acquires a plurality of third frequencies of the second measurement signal according to a third gate time $T_3$. It will be appreciated that each third frequency is a measurement frequency, corresponding to the third gate time $T_3$, of the second measurement signal and is determined based on Expression 1: $f_m$=counter/T. The plurality of third frequencies are acquired based on a plurality of continuous third gate times $T_3$.

The third adjustment sub-unit is configured to use a third step value to adjust the frequency of the reference clock signal on the basis that an absolute value of a difference between two adjacent third frequencies is greater than a third standard frequency difference and an error of the third frequencies is greater than a second accuracy error.

Specifically, the step of comparing the absolute value of the difference between the two adjacent third frequencies with the third standard frequency difference and comparing the error of the third frequencies with the second accuracy error includes correspondingly acquiring one third frequency in the first third gate time $T_3$, and correspondingly acquiring one third frequency in the second third gate time $T_3$. The second accuracy error is determined by the third gate time $T_3$, and the second accuracy error is used for representing an error range between the third frequency of the second measurement signal and the standard frequency of the second measurement signal.

Further, the absolute value of the difference between the two third frequencies of the two continuous third gate times $T_3$ participates in the first comparison, and the third step value is used to adjust the frequency of the reference clock signal under the conditions that the absolute value of the difference between the two adjacent third frequencies is greater than the third standard frequency difference and an error of the third frequencies is greater than the second accuracy error. After adjustment, in a third gate time $T_3$, one third frequency is correspondingly obtained. A difference between the third frequency of the second third gate time $T_3$ and the third frequency of the third third gate time $T_3$ is made, an absolute value of the difference is compared with the third standard frequency difference, and an error of the third frequency of the third third gate time $T_3$ is compared with the second accuracy error.

By analogy, cyclic comparison is performed until the absolute value of the difference between the two adjacent third frequencies is not greater than the third standard frequency difference and the error of the third frequencies is not greater than the second accuracy error, and the third step value is not used to adjust the frequency of the reference clock signal any more. It will be appreciated that, based on the third adjustment sub-unit, the third frequencies of the second measurement signal gradually converge and gradually approach a standard frequency value of the second measurement signal, which is determined based on a conditional expression $f_2=N_2f_0$.

The third standard frequency difference is determined based on a conditional expression of the standard frequency difference: $f_a=bN_2T$, where the gate time $T=T_3$.

In the embodiment of the present disclosure, the second measurement signal output by the second correction unit is further adjusting according to the third correction unit, according to the third adjustment sub-unit and based on comparison that the absolute value of the difference between the two adjacent third frequencies is greater than the third standard frequency difference and the error of the third frequencies is not greater than the second accuracy error, the third step value is used to adjust the frequency of the reference clock signal until the third frequencies of the second measurement signal gradually converge and approach the standard frequency value of the second measurement signal, such that the frequency of the reference clock signal is further corrected, and frequency output of the reference clock signal tends to a steady state.

In some embodiments, the gate time $T_3$ is greater than the gate time $T_2$, and the third step value is less than the second step value.

In some embodiments, the correction sub-module further includes a fourth correction unit, and the fourth correction unit includes a fourth acquisition sub-unit and a fourth adjustment sub-unit.

The fourth acquisition sub-unit is configured to acquire a fourth frequency of the second measurement signal according to a fourth gate time $T_4$.

It will be appreciated that the fourth frequency is a measurement frequency, corresponding to the fourth gate time $T_4$, of the second measurement signal and is determined based on Expression 1: $f_m$=counter/T.

The fourth adjustment sub-unit uses the fourth step value to adjust the frequency of the reference clock signal based on the fourth frequency acquired of the second measurement signal.

In the embodiment of the present disclosure, the second measurement signal output by the third correction unit is further adjusting according to the fourth correction unit, the fourth step value is used to adjust the frequency of the reference clock signal, and then frequency output of the reference clock signal tends to a steady state.

The gate time $T_4$ is greater than the gate time $T_3$, and the fourth step value is less than the third step value.

It is to be understood that the above specific embodiments in the present disclosure are for illustrative description or explanation of principles of the present disclosure only and not limitation of the present disclosure. Therefor, any modifications, equivalent substitutions, improvements, etc. without departing from the spirit and scope of the present disclosure are intended to be included within the scope of protection of the present disclosure. Furthermore, it is intended that the appended claims cover all variation and modifications that fall within the scope and boundaries of the appended claims or the equivalents of such scopes and boundaries.

What is claimed is:

1. A real-time correction method for an oven-controlled crystal oscillator, comprising the following steps:
   performing frequency multiplication on a reference clock signal to generate a first measurement signal and a second measurement signal; the reference clock signal is generated by an oven controlled crystal oscillator of an electromagnetic receiver;
   identifying a rising edge of each second pulse signal based on the first measurement signal to obtain a gate time T;
   acquiring a frequency of the second measurement signal according to the gate time T; and
   adjusting the frequency of the reference clock signal at least based on the fact that the absolute value of the difference between the frequencies of the two adjacent second measurement signals acquired is greater than a standard frequency difference; the standard frequency difference is determined according to the frequency multiplication coefficient of the second measurement signal, the gate time T and a measurement error;

wherein the step of performing frequency multiplication on the reference clock signal to generate the first measurement signal and the second measurement signal comprises the following steps:

performing frequency multiplication on the reference clock signal according to a conditional formula $f_1=N_1f_0$ to obtain the first measurement signal, where $f_0$ is the frequency of the reference clock signal, $f_1$ is the frequency of the first measurement signal, and $N_1$ is a positive integer; and performing frequency multiplication on the reference clock signal according to a conditional formula $f_2=N_2f_0$ to obtain the second measurement signal, where $f_2$ is the frequency of the second measurement signal, and $N_2$ is a positive integer;

wherein the value range of the frequency $f_0$ of the reference clock signal is 5-50 MHz, the frequency $f_1$ of the first measurement signal is ≤62.5 MHz, and the positive integer $N_2$ is equal to $nN_1$, where 4≤n≤16;

the step of adjusting the frequency of the reference clock signal comprises the following steps:

acquiring a first frequency of a plurality of second measurement signals according to a first gate time $T_1$; each first frequency is a measurement frequency, corresponding to the first gate time $T_1$, of the second measurement signal and is determined based on Expression 1: $f_m$=counter/T; further, counter is a count value, $f_m$ is a frequency measurement value; and adjusting the frequency of the reference clock signal by using a first step value based on the fact that the absolute value of the difference between the two adjacent first frequencies is greater than a first standard frequency difference; acquiring one first frequency correspondingly within a third first gate time $T_1$ after adjustment; calculating a difference between the first frequency of a second first gate time $T_1$ and the first frequency of the third first gate time $T_1$, and comparing the absolute value of the difference with the first standard frequency difference; performing circular comparison, and no longer adjusting the frequency of the reference clock signal by using the first step value until the absolute value of the difference between the two adjacent first frequencies is not greater than the first standard frequency difference; the first standard frequency difference is determined based on a conditional expression of the standard frequency difference: $f_a=bN_2T$, where the gate time $T=T_1$; wherein, $f_a$ is the standard frequency difference, b is a stability error, $N_2$ is a frequency multiplication coefficient of the second measurement signal;

wherein the frequency of the reference clock signal is adjusted by using the first step value until the absolute value of the difference between the two adjacent first frequencies is not greater than the first standard frequency difference, and the step of adjusting the frequency of the reference clock signal further comprises the following steps:

acquiring a second frequency of a plurality of second measurement signals according to a second gate time $T_2$; and adjusting the frequency of the reference clock signal by using a second step value based on the fact that the absolute value of the difference between the two adjacent second frequencies is greater than the second standard frequency difference and the error of the second frequency is greater than the first accuracy error; wherein the second gate time $T_2$ is equal to the first gate time $T_1$, and the second step value is equal to the first step value;

wherein a frequency meter and a shift register are designed, wherein the frequency meter is configured to count the frequency of the second measurement signal in each gate time; the shift register comprises five storage units and satisfies the "First In First Out" storage rule, that is, the first storage unit is configured for initial storage, and the measured values of the second measurement signal are shifted to the left in the order from the first storage unit to the fifth storage unit; the five storage units can store the measured values of five the second measurement signals, the measured values of two adjacent the second measurement signals are involved in a subtraction operation, and the measured values of five the second measurement signals satisfy four subtraction operations.

2. The real-time correction method for an oven-controlled crystal oscillator of claim 1, wherein the frequency of the reference clock signal is adjusted by using a second step value until the absolute value of the difference between the two adjacent second frequencies is not greater than the second standard frequency difference and the error of the second frequency is not greater than first accuracy error, and the step of adjusting the frequency of the reference clock signal further comprises the following steps:

acquiring a third frequency of a plurality of second measurement signals according to the third gate time $T_3$; and adjusting the frequency of the reference clock signal by using a third step value based on the fact that the absolute value of the difference between the two adjacent third frequencies is greater than the third standard frequency difference and the error of the third frequency is greater than the second accuracy error;

wherein the gate time $T_3$ is greater than the gate time $T_2$, and the third step value is less than the second step value.

3. The real-time correction method of an oven-controlled crystal oscillator of claim 2, wherein the frequency of the reference clock signal is adjusted by using a third step value until the absolute value of the difference between the two adjacent third frequencies is not greater than the third standard frequency difference and the error of the second frequency is not greater than second accuracy error, and the step of adjusting the frequency of the reference clock signal further comprises the following steps:

acquiring a fourth frequency of the second measurement signals according to the fourth gate time $T_4$; and adjusting the frequency of the reference clock signal by using a fourth step value based on the fourth frequency of the second measurement signal acquired;

wherein the gate time $T_4$ is greater than the gate time $T_3$, and the fourth step value is less than the third step value.

4. An electromagnetic receiver, comprising:

a frequency multiplication unit, configured to perform frequency multiplication on a reference clock signal to generate a first measurement signal and a second measurement signal; the reference clock signal is generated by an oven controlled crystal oscillator of an electromagnetic receiver;

an identification unit, configured to identify a rising edge of each pulse per second(PPS) signal based on the first measurement signal to obtain a gate time T;

a statistic unit, configured to acquire a frequency of the second measurement signal according to the gate time T; and a corrector module, configured to adjust the frequency of the reference clock signal at least based on the fact that the absolute value of the difference between the frequencies of the two adjacent second measurement signals acquired is greater than a standard frequency difference; the standard frequency difference is determined according to the frequency multiplication coefficient of the second measurement signal, the gate time T and a measurement error;

the frequency multiplication unit performs frequency multiplication on the reference clock signal according to a conditional formula $f_1=N_1f_0$ to obtain the first measurement signal, where $f_0$ is the frequency of the reference clock signal, $f_1$ is the frequency of the first measurement signal, and $N_1$ is a positive integer; and the frequency multiplication unit performs frequency multiplication on the reference clock signal according to a conditional formula $f_2=N_2f_0$ to obtain the second measurement signal, where $f_2$ is the frequency of the second measurement signal, and $N_2$ is a positive integer;

wherein the value range of the frequency $f_0$ of the reference clock signal is 5-50 MHz, the frequency $f_1$ of the first measurement signal is $\leq 62.5$ MHz, and the positive integer $N_2$ is equal to $nN_1$, where $4 \leq n \leq 16$;

the corrector module comprises a first correction unit, and the first correction unit comprises:

a first acquiring subunit, configured to acquire a first frequency of a plurality of second measurement signals according to a first gate time T1; each first frequency is a measurement frequency, corresponding to the first gate time $T_1$, of the second measurement signal and is determined based on Expression 1: $f_m$=counter/T; further, counter is a count value, $f_m$ is a frequency measurement value;

a first regulating subunit, configured to adjust the frequency of the reference clock signal by using a first step value based on the fact that the absolute value of the difference between the two adjacent first frequencies is greater than the first standard frequency difference; acquire one first frequency correspondingly within a third first gate time $T_1$ after adjustment; calculate a difference between the first frequency of a second first gate time $T_1$ and the first frequency of the third first gate time $T_1$, and compare the absolute value of the difference with the first standard frequency difference; perform circular comparison, and no longer adjust the frequency of the reference clock signal by using the first step value until the absolute value of the difference between the two adjacent first frequencies is not greater than the first standard frequency difference; the first standard frequency difference is determined based on a conditional expression of the standard frequency difference: $f_a=bN_2T$, where the gate time $T=T_1$; wherein, $f_a$ is the standard frequency difference, b is a stability error, $N_2$ is a frequency multiplication coefficient of the second measurement signal;

the corrector module also comprises a second correction unit, and a second correction unit comprises:

a second acquiring subunit, configured to acquire a second frequency of a plurality of second measurement signals according to a second gate time $T_2$;

a second regulating subunit, configured to adjust the frequency of the reference clock signal by using a second step value based on the fact that the absolute value of the difference between the two adjacent second frequencies is greater than the second standard frequency difference and the error of the second frequency is greater than the first accuracy error;

wherein the second gate time $T_2$ is equal to the first gate time $T_1$, and the second step value is equal to the first step value;

wherein a frequency meter and a shift register, wherein the frequency meter is configured to count the frequency of the second measurement signal in each gate time;

the shift register comprises five storage units and satisfies the "First In First Out" storage rule, that is, the first storage unit is configured for initial storage, and the measured values of the second measurement signal are shifted to the left in the order from the first storage unit to the fifth storage unit; the five storage units can store the measured values of five the second measurement signals, the measured values of two adjacent the second measurement signals are involved in a subtraction operation, and the measured values of five the second measurement signals satisfy four subtraction operations.

5. The electromagnetic receiver of claim 4, wherein the corrector module also comprises a third correction unit, and the third correction unit comprises:

a third acquiring subunit, configured to acquire a third frequency of a plurality of second measurement signals according to the third gate time $T_3$;

a third regulating subunit, configured to adjust the frequency of the reference clock signal by using a third step value based on the fact that the absolute value of the difference between the two adjacent third frequencies is greater than the third standard frequency difference and the error of the third frequency is greater than the second accuracy error;

wherein the gate time $T_3$ is greater than the gate time $T_2$, and the third step value is less than the second step value.

6. The electromagnetic receiver of claim 5, wherein the corrector module also comprises a fourth correction unit, and the fourth correction unit comprises:

a fourth acquiring subunit, configured to acquire a fourth frequency of the second measurement signals according to the fourth gate time $T_4$;

a fourth regulating subunit, configured to adjust the frequency of the reference clock signal by using a fourth step value based on the second measurement signal acquired;

wherein the gate time $T_4$ is greater than the gate time $T_3$, and the fourth step value is less than the third step value.

* * * * *